United States Patent [19]

Ansell et al.

[11] 4,300,115
[45] Nov. 10, 1981

[54] MULTILAYER VIA RESISTORS

[75] Inventors: Joseph L. Ansell, Gaithersburg; Raymond J. Baker, Beltsville, both of Md.

[73] Assignee: The United States of America as represented by the Secretary of the Army, Washington, D.C.

[21] Appl. No.: 155,713

[22] Filed: Jun. 2, 1980

[51] Int. Cl.³ .............................................. H01C 1/012
[52] U.S. Cl. ................................... 338/314; 29/610 R; 338/260; 338/320
[58] Field of Search ................ 338/305, 304, 317–321, 338/333, 334, 314, 223–226, 254, 256, 260; 29/610 R

[56] References Cited

U.S. PATENT DOCUMENTS

| 3,210,831 | 10/1965 | Johnson et al. | 338/223 X |
| 3,670,214 | 6/1972 | Hagen | 338/226 X |
| 3,727,165 | 4/1973 | Hagen | 338/223 X |
| 4,179,797 | 12/1979 | Johnson | 338/320 |

Primary Examiner—C. L. Albritton
Attorney, Agent, or Firm—Nathan Edelberg; Robert P. Gibson; Saul Elbaum

[57] ABSTRACT

A substrate has two or more conductive layers deposited thereon, each adjacent layer pair separated by a dielectric layer. Apertures are formed in the dielectric layer and are filled with resistor paste. In this way, a resistive path may be formed between the conductive layers. This concept of fabricating resistors are particularly useful in the inclusion of pull-up, pull-down and other non-critical resistors in the circuitry contained within a thick film construction.

1 Claim, 2 Drawing Figures

MULTILAYER VIA RESISTORS

RIGHTS OF THE GOVERNMENT

The invention described herein may be manufactured, used, and licensed by or for the United States Government for governmental purposes without the payment to us of any royalty thereon.

BRIEF DESCRIPTION OF THE PRIOR ART

In the design of digital circuitry, designers frequently utilize pull-up and/or pull-down resistors in thick film structures. These are resistors which are permanently tied from a signal line to B+ or ground, as appropriate. Advantageously, when used in conjunction with certain thick film circuits, such as CMOS circuits, wide tolerance of resistance is permissible and therefore resistors of great precision are not necessary. In a typical thick film structure, a substrate supports first and second conductive layers, separated by a dielectric layer. The conductive layers include circuits and connecting leads as well as the previously mentioned pull-up and pull-down resistors. Formation of such resistors has been achieved by depositing resistive paste between conductors on the same conductive layer. However, as will be appreciated, this consumes valuable surface area which is often needed for accommodating more circuitry.

In the past, electrical short circuit connections between multiple conductive layers have been achieved by forming an aperture or "via" in a dielectric layer between the conductive layers to be connected. During the depositing of the various layers, the via is filled with conductive material so that signals may flow from circuitry on one conductive layer to the next. A similar method for interconnecting conductive layers occurs in conventional printed circuit board constructions.

BRIEF DESCRIPTION OF THE PRESENT INVENTION

The present invention provides a method and means for utilizing vias in multi-layer circuit constructions, such as thick films, printed circuit boards, and the like, for receiving a resistive element interconnecting conductive layers. Although, as mentioned in the previous Brief Description of the Prior Art, such vias have been filled in the past with conductive material between conductive layers, to the best of the inventors' knowledge, no one has conceived of the concept of filling such vias with conventional resistor paste. In circuit applications where loosely toleranced resistors are acceptable, such a resistor construction is ideal. Of course, tighter tolerance resistor constructions may be effected but require greater effort during the fabrication process.

The above-mentioned objects and advantages of the present invention will be more clearly understood when considered in conjunction with the accompanying drawings, in which:

DETAILED DESCRIPTION OF THE INVENTION

Figure 1:
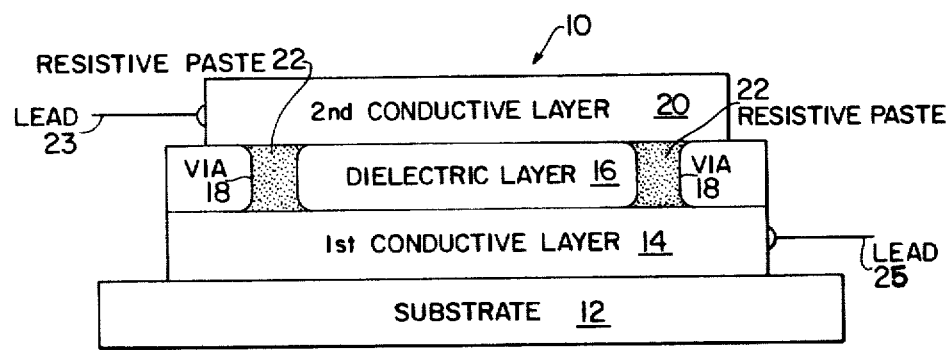
FIG. 1 is a diagrammatic view of a multi-layer construction incorporating the present invention.

Referring to the figures and more particularly FIG. 1 thereof, a multi-layer structure is generally indicated by reference numeral 10. A substrate 12 forms the support for the multi-layer structure. Typically, the substrate material is alumina oxide $Al_2O_3$ having a thickness of 25 mils. Such a material is available with a 96 percent alumina oxide content from the American Lava Company of Laurens, South Carolina. A first conductive layer 14 is printed on the substrate 12 by utilizing a conventional thick film screening processor such as the type bearing Model No. 330, manufactured by Affiliated Manufacturing, Inc. of North Branch, New Jersey. Screens including the desired conductive layer configuration will be custom designed by commercial sources, such as Micro Circuit Engineering Company of Mount Holley, New Jersey. The material of the first conductive layer 14 is provided in the form of a conductor paste containing noble metals such as gold. Non-noble metals may also be employed. Such a conductor paste is available from Cermalloy, Inc. of Conshohocken, Pennsylvania, and in a typical application, paste No. 4398 from the identified source may be employed.

Next, the printed first conductive layer undergoes drying to remove the solvents in the conductive paste. To complete the depositing of the first conductive layer, it must undergo firing in a furnace for achieving sintering of the conductive material. Typically, the temperature for achieving such sintering is 925 degrees C., this temperature being maintained for ten minutes at peak. A typical furnace for achieving firing is available from GS Tempress, Inc. of Watertown, Wisconsin.

Next, a dielectric layer 16 is printed atop the first conductive layer 14. The material of this dielectric layer may be glass, ceramic or other insulating materials. In a preferred embodiment, a dielectric material identified as Cermalloy 9115, available from the previously mentioned source, is employed. The dielectric layer is characterized by an insulation resistance of greater than 10 tera ohms per unit thickness, the thickness being 1-2 mils. The screen for the dielectric layer 16 is designed to mask the deposition of material in the areas which form apertures or vias 18. After drying and firing, as previously discussed in connection with the first conductive layer, the depositing of the dielectric layer 16 is completed.

A resistive paste 22 is then screened onto the dielectric layer 16 so that it fills the vias 18. The material of this resistive layer may be carbon, CERMET or other oxide materials. In a preferred embodiment, a resistive material identified as Cermalloy 1600A, available from the previously mentioned source, is employed. The resistive material is characterized by typical resistance of 1 Megohm per unit area for a thickness of 1 mil. The resistive paste then undergoes drying and firing in much the same manner as previously mentioned in connection with the first conductive layer 14 and dielectric layer 16.

Atop the completed dielectric layer 16, with the filled resistive vias is a second conductive layer 20 which is deposited onto the dielectric layer 16 in the same manner as the first conductive layer 14. Lead 23 is attached to the second conductive layer 20 and lead 25 is attached to the first conductive layer 14 in conventional fashion so that signals may flow between the conductive layers. In actuality, both conductive layers include a plurality of circuits and the resistor-filled vias 18 may be employed as pull-up or pull-down resistors between such circuits respectively deposited on the first and second conductive layers.

Figure 2:
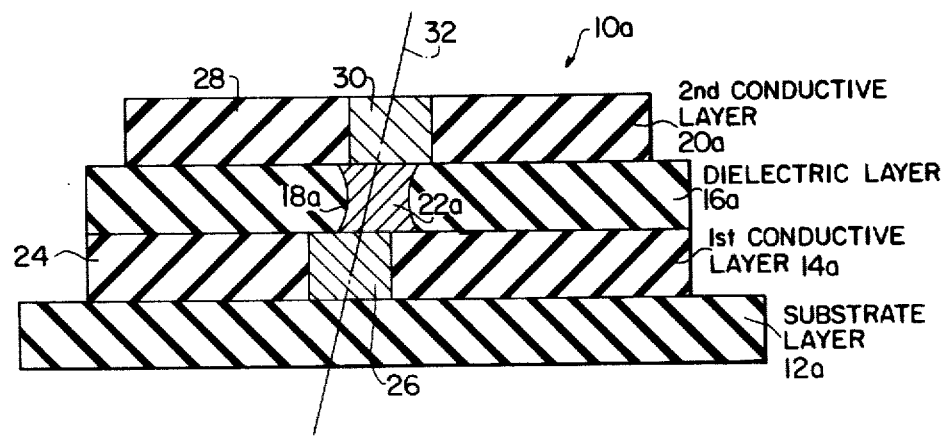
FIG. 2 is a cross-sectional view of a multi-layer structure including a second embodiment of the present invention.

FIG. 2 shows an alternate embodiment 10a of the invention wherein the degree of resistivity of the filled via may be increased by misaligning conductors above and below a via. The following layers correspond to the layers outlined in connection with FIG. 1: substrate layer 12a, first conductive layer 14a, dielectric layer 16a and second conductive layer 20a. The multi-layer structure of FIG. 2 shows the first and second conductive layers 14a and 20a as each comprising conductor and insulative portions. Conductor portion 26 (in the first conductive layer 14a) is seen to be positioned out of registry with conductor portion 30 (in the second conductive layer 20a). The via 18a, filled with resistive paste 22a is interposed between the conductor portions 26 and 30. The misalignment of the conductor portions relative to the resistor-filled via 18a is indicated by axis 32. For purposes of convenient illustration, insulative portion 24 is shown surrounding the conductor portion 26 while insulator portion 28 is shown surrounding conductor portion 30. By achieving the misalignment of the conductor portions 26 and 30, the interfaces between conductor portions and corresponding surfaces of the resistor-filled via are reduced and greater resistance may be realized than by aligning these conductor portions vertically, relative to via 18a. Further, the resistance may be varied by proper selection of the resistor paste.

Although the structure set forth in FIGS. 1 and 2 have been explained in connection with thick films, it is to be understood that the use of a resistor-filled via, as explained herein, has applicability to any multi-layer circuit configuration such as printed circuit boards.

It should be understood that the invention is not limited to the exact details of construction shown and described herein for obvious modifications will occur to persons skilled in the art.

We claim the following:

1. In a multi-layer circuit structure having first and second layers separated by a non-conducting layer, the improvement comprising, a first conductor portion associated with said first layer and a second conductor portion associated with said second layer, an aperture means formed in said non-conducting layer, and resistive material located in said aperture means, said first and second conductor portions being positioned adjacent opposite portions of said resistive material and partially overlapping opposite portions of said aperture means, whereby an electrically conductive path is established between said first and second conductor portions, and the resistance of said path is dependent upon the extent of overlap of said conductor portions with said aperture means and resistive material.

* * * * *